United States Patent
Lee et al.

(10) Patent No.: US 7,234,095 B2
(45) Date of Patent: Jun. 19, 2007

(54) TURBO ENCODED HYBRID AUTOMATIC REPEAT REQUEST SYSTEM AND ERROR DETECTION METHOD

(75) Inventors: Jae Hong Lee, Seoul (KR); Tae Min Kim, Seoul (KR); Hyun Dong Shin, Seoul (KR)

(73) Assignee: Dept. of Management: Seoul National University (KR)

( * ) Notice: Subject to any disclaimer, the term of this patent is extended or adjusted under 35 U.S.C. 154(b) by 900 days.

(21) Appl. No.: 10/316,449

(22) Filed: Dec. 11, 2002

(65) Prior Publication Data

US 2004/0010743 A1  Jan. 15, 2004

(30) Foreign Application Priority Data

Jul. 11, 2002  (KR) .................... 10-2002-0040159

(51) Int. Cl.
*H04L 1/18* (2006.01)
*H03M 13/29* (2006.01)

(52) U.S. Cl. .................. 714/751; 714/755; 714/758; 714/776; 714/781

(58) Field of Classification Search .............. 714/751, 714/755, 758, 776, 781; *H03M 13/29; H04L 1/18*
See application file for complete search history.

(56) References Cited

U.S. PATENT DOCUMENTS

| | | | | |
|---|---|---|---|---|
| 3,678,469 | A | * | 7/1972 | Freeman et al. ............ 714/781 |
| 5,475,716 | A | * | 12/1995 | Huang ........................ 375/354 |
| 5,721,745 | A | * | 2/1998 | Hladik et al. ............... 714/755 |
| 6,304,995 | B1 | * | 10/2001 | Smith et al. ................ 714/786 |
| 6,757,859 | B1 | * | 6/2004 | Jin ............................. 714/755 |
| 2002/0176362 | A1 | * | 11/2002 | Yun et al. ................... 370/328 |
| 2002/0196812 | A1 | * | 12/2002 | Yamaguchi et al. ........ 370/389 |
| 2003/0063606 | A1 | * | 4/2003 | Odenwalder et al. ....... 370/389 |

(Continued)

FOREIGN PATENT DOCUMENTS

EP       11154576       * 11/2001

(Continued)

OTHER PUBLICATIONS

J. Meel: "Spread Spectrum (SS) Applications": Dec. 1999: Hogeschool Voor Wetenscap & Kunst [De Nayer Instituut]: V.2: pp. 1-19: URL: http://www.sss-mag.com/pdf/Ss_jme_denayer_appl_print.pdf.*

(Continued)

*Primary Examiner*—R. Stephen Dildine
(74) *Attorney, Agent, or Firm*—Keusey, Tutunjian & Bitetto, P.C.

(57) ABSTRACT

A turbo encoded H-ARQ system and an error detection method are disclosed, and more particularly, a turbo encoded H-ARQ system and an error detection method that lower an undetected error probability and frame error rates by increasing the degree of an equivalent CRC generator polynomial by using a modified trellis termination. It has been made possible to obtain an equivalent CRC generator polynomial having higher degree than the related art CRC generator polynomial by employing a modified trellis termination. This achieved a lower undetected error probability than the related art undetected error probability by using an equivalent CRC generator polynomial having higher degree. This also achieved lower frame error rates, when the same number of overhead bits are used, due to the lower undetected error probability.

6 Claims, 11 Drawing Sheets

U.S. PATENT DOCUMENTS

| | | | |
|---|---|---|---|
| 2003/0159100 A1* | 8/2003 | Buckley et al. | 714/758 |
| 2003/0206561 A1* | 11/2003 | Schmidl et al. | 370/522 |
| 2003/0227875 A1* | 12/2003 | Wei et al. | 370/252 |

FOREIGN PATENT DOCUMENTS

| | | | |
|---|---|---|---|
| EP | 1168703 A1 | * | 1/2002 |
| EP | 11168702 | * | 1/2002 |
| EP | 1211840 A1 | * | 6/2002 |
| GB | 2357017 A | * | 6/2001 |
| JP | 03117242 A | * | 5/1991 |
| JP | 03262292 A | * | 11/1991 |
| JP | 09238125 A | * | 9/1997 |
| JP | 10022984 A | * | 1/1998 |
| JP | 2003179580 A | * | 6/2003 |

OTHER PUBLICATIONS

Wikpedia entry for "Cyclic Redundancy Check", May 28, 2005 URL: http://en.wikipedia.org/wiki/Cyclic_redundancy_check.*

Wikpedia entry for "Turbo code" Jun. 8, 2005 URL: http://en.wikipedia.org/wiki/Turbo_code#The_encoder.*

Automatic repeat request (ARQ). Hargrave's Communications Dictionary, Wiley (2001). Retrieved Jun. 10, 2005, from xreferplus. http://www.xreferplus.com/entry/2717554□□.*

W. J. Blackert, E. K. Hall and S. G. Wilson; Turbo Code Termination and Interleaver Conditions; Electron. Lett., vol. 31, No. 24, pp. 2082-2084; Nov. 1995.

S. K. Leung-Yan-Cheong, and M. E. Hellman; Concerning a Bound on Undetected Error Probability; IEEE Trans. Inform. Theory; vol. 22, No. 1, pp. 235-237; Mar. 1975.

D. Chase; Code Combining a Maximum-likelihood Decoding Approach for Combining an Arbitrary Number of Noisy Packets; IEEE Trans. Commun.; vol. 33, No. 5; pp. 385-393; May 1985.

M. E. Buckley and S. B. Wicker; The Design and Performance of a Neural Network for Predicting Turbo Decoding Error with Application to Hybrid ARQ Protocols; IEEE Tran Commun.; vol. 48, No. 4; pp. 568-576; Apr. 2000.

P. Coulton, C. Tanriover, B. Wright and B. Honary; Simple Hybrid Type II ARQ Technique Using Soft Output Information; Electron. Lett.; vol. 36, No. 20; pp. 1716-1717; Sep. 2000.

S. Lin and D. J. Costello, Jr.; Error Control Coding: Fundamentals and Applications; Prentice-Hall; pp. 477-481; 1985.

R. E. Blahut; Theory and Practice of Error Control Codes; Addison-Wesley, pp. 431-439; 1984.

* cited by examiner

Fig.8

| (N,K) | q | CRC Generator Polynomial | $d_{min}$ | $Ad_{min}$ |
|---|---|---|---|---|
| (1021,1013) | 8 | $g_{CRC}(x) = x^8 + x^7 + x^6 + x^5 + 1$ | 2 | 1534 |
| (1024,1013) | 8 | $g_e(x) = x^{11} + x^{10} + x^8 + x^7 + 1$ $= g_1(x) \cdot (x^8 + x^4 + x^3 + x^2 + 1)$ | 3 | 85131 |
| (1021,1009) | 12 | $g_{CRC}(x) = x^{12} + x^{11} + x^8 + x^4 + 1$ | 4 | 18319200 |
| (1024,1009) | 12 | $g_e(x) = x^{15} + x^{14} + x^{11} + x^{10} + x^9 + x^6 + x^4 + x^3 + 1$ $= g_1(x) \cdot (x^{12} + x^9 + x^7 + x^6 + x^5 + x^2 + 1)$ | 4 | 1560520 |

TURBO ENCODED HYBRID AUTOMATIC REPEAT REQUEST SYSTEM AND ERROR DETECTION METHOD

BACKGROUND OF THE INVENTION

1. Field of the Invention

The present invention relates to a turbo encoded Hybrid Automatic Repeat reQuest (ARQ) system and an error detection method and, more particularly, to a turbo encoded Hybrid Automatic Repeat reQuest (ARQ) system and an error detection method which lowers undetected error probability and frame error rates by modifying trellis termination and thus by increasing the degree of the equivalent Cyclic Redundancy Check (CRC) generator polynomial.

2. Description of the Related Art

In general, as demand for high speed data transmission increases, a wireless communication system having high bandwidth efficiency and reliability is required. In order to satisfy such demand, a wireless communication system may employ a Hybrid Automatic Repeat reQuest (hereinafter, H-ARQ) method. The H-ARQ is a packet retransmission technique that assures high reliability communication by combining the Forward Error Correction (hereinafter, FEC) method and Automatic Repeat reQuest (hereinafter, ARQ) method.

Here, the FEC is a technique by which errors deemed to have occurred at the channel are corrected through the use of the structural characteristic of the code. The term 'forward' in the FEC is originated from the characteristics that, even if errors occur at a received frame, a receiver does not request additional information for correcting errors from the transmitter but, rather, corrects errors at the receiver independently to the maximum extent possible. That is to say, in the FEC, even if there are errors that have not been corrected after decoding, the decoding result is processed to the next step without a request for retransmission.

The H-ARQ transmits message symbols to be transmitted, parity symbols for error correction and parity symbols for error detection. The H-ARQ is divided into two types: type 1 H-ARQ and type 2 H-ARQ depending on what order the parity symbols are transmitted.

The type 1 H-ARQ is a method of transmitting message symbols, parity symbols for error correction and parity symbols for error detection together at the same time on every transmission. In type 1, because frames always having the same structure are transmitted, there is an advantage that the structure of the transmitter and the receiver is simple, although adaptability to a channel situation may be inferior.

On the other hand, the type 2 H-ARQ is a method of transmitting message symbols and parity symbols for error detection on the first transmission and transmitting parity symbols for error correction only when the receiver requests retransmission. Because the type 2 H-ARQ transmits parity symbols for error correction only when errors have occurred, the system operates flexibly by being adaptive to a channel situation and thus the overall efficiency of the system is superior to that of the type 1 H-ARQ.

Hereinafter, it will be explained with reference to FIG. 1 as to a turbo encoded H-ARQ system of the related art to which the H-ARQ is applied. Particularly, the system adopting the type 1 H-ARQ will primarily be explained.

FIG. 1 is a block diagram that illustrates a turbo encoded H-ARQ system in the related art.

The related art turbo encoded H-ARQ system comprises a transmitter (10) and a receiver (20). The transmitter (10) comprises a turbo encoder (11) that turbo-encodes packets to be transmitted, and the receiver (20) comprises a turbo decoder (21) that performs the FEC against errors included in received packets, and an error detector (22) detects whether errors are included in the corrected packets and transmits signals requesting retransmission of packets to the transmitter (10), if there are errors in the corrected packets.

Hereinafter, the operation of the related art turbo encoded H-ARQ system having the above-explained structure will be explained.

First, the transmitter (10) turbo-encodes a packet to be transmitted by using the turbo encoder (11) and transmits the turbo encoded packet through the channel to the receiver (20). In the type 1 H-ARQ, each transmitted packet includes additional bits for error correction and error detection.

Then, the receiver (20) receives the packet transmitted through the channel. Thereafter, the turbo decoder (21) performs FEC against errors included in the received packet.

The error detector (22) detects whether errors are included in the corrected packet and transmits a signal requesting retransmission of the packet to the transmitter (10) if there are errors in the corrected packet. In other words, if it is determined that no error exists in the corrected packet, an ACKnowledgment (hereinafter, ACK) signal is sent back to the transmitter (10). On the other hand, if it is determined that errors exist in the corrected packet, a Not AcKnowledgment (hereinafter, NAK) signal is sent back to the transmitter (10).

Accordingly, the transmitter (10) receives ACK signals and NAK signals, which are signals related to request for retransmission of packets, and retransmits relevant packets to the receiver (20) according to the relevant received signals. In other words, if the transmitter (10) receives an ACK signal, the transmitter does not retransmit any packet to the receiver (20). On the other hand, if the transmitter (10) receives a NAK signal, the transmitter retransmits a packet having the same structure as the packet transmitted previously by the transmitter to the receiver (20) (See e.g., S. Lin and J. Costello, Error Control Coding: Fundamentals and Applications. Prentice-Hall, 1985).

Particularly, if the Chase Combining, which performs decoding by considering a set of codes received on every transmission as one code having a lower code rate, is employed, the performance of type 1 H-ARQ is improved remarkably (See, D. Chase, "Code combining a maximum-likelihood decoding approach for combining an arbitrary number of noisy packets," IEEE Trans. Commun., vol. 33, No. 2, 385–393, May 1985).

On the other hand, it is known that a turbo code suggested first in 1993 by Berrou et al. shows the superior error correction performance, which approaches the Shannon Limit.

Hereinafter, one example of a turbo encoder (11) structure illustrated in FIG. 1 will be explained with reference to FIG. 2.

FIG. 2 is a diagram illustrating the structure of the related art turbo encoder (11) illustrated in FIG. 1.

In the related art turbo encoder (11), at least two Recursive Systematic Convolution Encoders (Hereinafter, "RSC encoders") (12, 13) are combined in parallel with an interleaver (14) in between RSC encoders.

Because residual errors after the turbo encoding are detected through the error detector (22) in the related art turbo encoded H-ARQ system illustrated in FIG. 1, the related art turbo encoded H-ARQ system has a lower error floor than pure turbo encoded systems.

On the other hand, a number of error detection methods that do not require additional overhead bits in the turbo encoded H-ARQ system have been suggested, for example, M. E. Buckley and S. B. Wicker, "The design and performance of a neural network for predicting turbo decoding error with application to hybrid ARQ protocols," IEEE Trans. Commun., vol. 48, No. 4, 566–576, April 2000, and P. Coulton, C. Tanriover, B. Wright, and B. Honary, "Simple hybrid type 2 H-ARQ technique using soft output information," Electron. Lett., vol. 36, No. 20, 1716–1717, September 2000. However, these error detection methods have higher undetected error probabilities than the CRC error detection method. The CRC error detection method adds parity symbols for error detection to message symbols to be transmitted and determines whether errors exist by using the structure of the parity symbol for error detection with the hard decision value made on the FEC encoded frame at a receiver. The parity symbol for error detection is added to the message symbol using a CRC encoder. The above-mentioned undetected error probability means the probability of making a wrong decision that errors do not exist in the frame in which errors actually exist. The high undetected error probability results in high frame error rates in H-ARQ systems.

Hereinafter, an explanation will be given with reference to FIG. 3 as to the related art CRC error detection method applied to a turbo encoded H-ARQ system.

FIG. 3 is a block diagram illustrating the CRC error detection method in a related art turbo encoded H-ARQ system.

A turbo encoded H-ARQ system, to which the related art CRC error detection method applies, comprises a transmitter (10) and a receiver (20).

Here, the transmitter (10) comprises a CRC encoder (15), a turbo encoder (11) and a modulator (16). The CRC encoder (15) CRC encodes message symbols to be transmitted into new message symbols by adding parity symbols for error detection to the message symbols to be transmitted. The turbo encoder (11) turbo encodes the CRC encoded new message symbols. The modulator (16) modulates the CRC encoded and turbo encoded new message symbols to channel symbols and transmits the CRC encoded and turbo encoded new message symbols to the receiver (20).

The receiver (20) comprises a demodulator (23), a turbo decoder (21) and a CRC decoder (24). The receiver (20) receives the modulated channel symbols, demodulates the received channel symbols to CRC encoded and turbo encoded new message symbols. The turbo decoder (21) turbo decodes the demodulated CRC encoded and turbo encoded new message symbols to CRC encoded new message symbols. The CRC decoder (24) CRC decodes the turbo decoded frame, detects whether there are errors included in the CRC decoded frame and transmits a signal requesting retransmission of symbols to the transmitter (10) according to the existence of errors.

Hereinafter, an explanation will be given as to a turbo encoded H-ARQ system, having the above-explained structure, to which the related art CRC error detection method is applied.

First, the CRC encoder (15) in the transmitter (10) performs CRC encoding, generating new message symbols by adding parity symbols for error detection to message symbols to be transmitted, using a CRC generator polynomial.

In order to illustrate the CRC encoding, the sequence of the message symbol can be expressed as i(x) and the CRC generator polynomial can be expressed as $g_{CRC}(x)$. Then, assume that the CRC encoder (15) has the following CRC generator polynomial $g_{CRC}(x)$.

$$g_{CRC}(x) = 1 + c_1 x + c_2 x^2 + \ldots + c_{n-k-1} x^{n-k-1} + x^{n-k} \quad \text{[Equation 1]}$$

Then, the CRC encoding process may be expressed as follows.

$$i_1(x) = i(x)x^{n-k} + P(x) \quad \text{[Equation 2]}$$
$$= i(x)g_{CRC}(x)$$

Here, p(x) means the sequence of a parity symbol added to the ending part of a message symbol in the CRC encoder (15) and $i_1(x)$ means the sequence of the new message symbol to which the parity symbol is added through CRC encoding.

Thereafter, the turbo encoder (11) turbo encodes the CRC encoded new message symbols.

The modulator (16) modulates the CRC encoded and turbo encoded new message symbols to channel symbols and transmits the modulated channel symbols to the receiver (20). In other words, $i_1(x)$, the CRC encoded new message symbol at the CRC encoder (15), is turbo encoded at the turbo encoder (11), modulated to a channel symbol at the modulator (16) and transmitted to the receiver (20).

Then, the demodulator (23) in the receiver (20) receives the modulated channel symbols and demodulates the received channel symbols to the CRC encoded and turbo encoded new message symbols.

The turbo decoder (21) turbo decodes the demodulated CRC encoded and turbo encoded new message symbols and outputs a hard decision value made upon the frame of the CRC encoded new message symbols. At this time, the hard decision value outputted, after going through the channel and demodulation, from the turbo decoder (21) for FEC is as follows.

$$\hat{i}(x) = i_1(x) + e(x) \quad \text{[Equation 3]}$$
$$= i(x)g_{CRC}(x) + e(x)$$

Here, $\hat{i}(x)$ is the sequence of a CRC encoded new message symbol, which has been turbo decoded, that is to say, has passed through the forward error correction. e(x) is the error sequence.

CRC decoder (24) CRC decodes the turbo decoded symbol frame, detects whether there are any errors in the CRC decoded frame and transmits a signal requesting retransmission of the symbol to the transmitter (10) according to the existence of errors.

More particularly, the CRC decoder (24) detects errors by dividing $\hat{i}(x)$ by $g_{CRC}(x)$, which is the CRC generator polynomial used in the CRC encoding. If the error sequence e(x) is zero (that is to say, if no error exists in the FEC processed frame), $\hat{i}(x)$ may be divided by $g_{CRC}(x)$ without any remainder. On the other hand, if the error sequence e(x) is not zero (that is to say, if errors exist in the FEC processed frame), diving $\hat{i}(x)$ by $g_{CRC}(x)$ leaves a remainder. In other words, e(x)mod $g_{CRC}(x)$ is left after the division.

Accordingly, the CRC decoder (24) transmits an ACK signal to the transmitter (10) based on the determination of the CRC decoder (24) that no error has occurred if $\hat{i}(x)$ may be divided by CRC generator polynomial $g_{CRC}(x)$ without any remainder. On the other hand, the CRC decoder (24)

transmits a NAK signal to the transmitter (10) based on the determination of the CRC decoder (24) that errors have occurred if $\hat{i}(x)$ is not divided by the CRC generator polynomial $g_{CRC}(x)$.

When detecting errors using the CRC decoder (24) as described above, the detecting standard is as follows.

$$\hat{i}(x) \bmod g_{CRC}(x) = \{i(x)g_{CRC}(x) + e(x)\} \bmod g_{CRC}(x) \quad \text{[Equation 4]}$$
$$= e(x) \bmod g_{CRC}(x)$$

According to the above description, the transmitter (10) receives ACK and NAK signals, which are signals related to request for retransmission of symbols, and retransmits message symbols to the receiver (20) according to the type of the received signals. In other words, if the transmitter (10) receives an ACK signal, the transmitter does not retransmit any message symbol to the receiver (20). On the other hand, if the transmitter receives a NAK signal, the transmitter retransmits to the receiver (20) a message symbol having the same structure with the message symbol previously transmitted.

There are problems in the above-described related art turbo encoded H-ARQ system in that additional overhead bits are required in order to achieve a low undetected error probability. Also, the throughput of the related art turbo encoded H-ARQ system is lowered as the number of overhead bits increases. Further, frame error rates are increased by the increase of the undetected error probability of the turbo encoded H-ARQ system if the number of overhead bits is maintained small in order to improve the throughput.

SUMMARY OF THE INVENTION

To solve problems mentioned above, a turbo encoded H-ARQ system is implemented with lower frame error rates by achieving the lowest undetected error probability for a given number of overhead bits. In one embodiment, the present invention achieves this by making an equivalent CRC generator polynomial have a higher degree than the related art CRC generator polynomial by modifying a trellis termination.

To solve the above-mentioned problems, a turbo encoded H-ARQ system according to the present invention comprises: a transmitter that, by equivalently CRC encoding inputted data bits using an equivalent CRC generator polynomial, performs CRC encoding and pre-termination simultaneously, multiplexes turbo encoded bits according to the equivalent CRC encoded output bits, maps the multiplexed output bits to the channel symbol by the bit interleaving, and transmits the channel symbol in the packet form to a receiver; and a receiver that receives the channel symbol transmitted in the packet form from the transmitter, computes the bit metric for bits that constitute an equivalent CRC encoded and turbo encoded new message symbol, de-multiplexes the received channel symbol by the bit de-interleaving, turbo decodes the de-multiplexed message symbol iteratively by using the computed bit metric, detects whether there are any errors included in the packet by CRC decoding the forward error correction processed frame, that is to say, which has passed through the iterative turbo decoding, and transmits a signal related to the request for retransmission of a packet according to the existence of errors.

The transmitter preferably comprises: an equivalent CRC encoder that performs both CRC encoding and pre-termination simultaneously by performing the equivalent CRC encoding of data bits to be transmitted using an equivalent CRC generator polynomial; a turbo encoder that turbo encodes the equivalent CRC encoded output bits; a multiplexer that multiplexes the turbo encoded output bits; a bit interleaver that performs the bit interleaving in order to rearrange the order of the multiplexed output bits; and a modulator that maps the bit interleaved output bits to a channel symbol and transmits the channel symbol in the packet form to the receiver.

The equivalent CRC encoder preferably comprises: a CRC encoder that CRC encodes data bits to be transmitted using a CRC generator polynomial and outputs the encoded data bits; and a pre-termination encoder that performs pre-termination of the CRC encoded output bits using a feedback polynomial and outputs the output bits, of which were performed pre-termination.

The turbo encoder preferably comprises: the first component RSC encoder that turbo encodes the equivalent CRC encoded output bits according to the original input order and outputs the first output additional bits; the first turbo interleaver that turbo interleaves the equivalent CRC encoded output bits in order to rearrange the input order of the equivalent CRC encoded output bits; and the second component RSC encoder that performs the turbo encoding according to the order of the equivalent CRC encoded output bits which were turbo interleaved by the first turbo interleaver and outputs the second output additional bits.

The receiver preferably comprises: a demodulator that receives a channel symbol transmitted in the packet form from the modulator and computes a bit metric for bits that constitute the equivalent CRC encoded and turbo encoded new message symbol; a bit de-interleaver that performs the bit de-interleaving in order to rearrange the order of the computed bit metric into the original order; a de-multiplexer that de-multiplexes the bit de-interleaved bit metric; a turbo decoder that turbo decodes the message symbol iteratively using the de-multiplexed bit metric; and a CRC decoder that detects whether there are errors in the packet by CRC decoding the forward error correction processed frame, that is to say, which has passed through the iterative turbo decoding and then transmits to the transmitter a signal related to the request for retransmission of a packet according to the existence of errors.

The turbo decoder preferably comprises: a first SISO decoder that outputs renewed first extrinsic information using a systematic bit metric and a first output additional bit metric outputted from the de-multiplexer and the second extrinsic information outputted from the turbo de-interleaver; the second turbo interleaver performs turbo interleaving in order to rearrange the order of the outputted first extrinsic information; a second SISO decoder that outputs renewed second extrinsic information using the systematic bit metric outputted from the de-multiplexer, the second output additional bit metric and the first extrinsic information being output from the second turbo interleaver; a turbo de-interleaver that performs turbo de-interleaving in order to arrange the order of the outputted second extrinsic information according to the original order; and a decision maker that makes a hard decision on the turbo interleaved soft output.

An error detection method of the present invention comprises: (a) transmitting a channel symbol in packet form after equivalently CRC encoding inputted data bits; and (b) detecting whether there are any errors included in the packet by CRC decoding the channel symbol in the packet form.

The said (a) transmitting channel symbol in packet form after equivalently CRC encoding inputted data bits comprises: (c) outputting the CRC encoded output bits after CRC encoding the data bits to be transmitted using a CRC generator polynomial; (d) outputting the output bits, of which were performed pre-termination, after performing pre-termination of the CRC encoded output bits for pre-termination using a feedback polynomial; (e) outputting the turbo encoded output bits, of which were performed pre-termination, by turbo encoding; (f) multiplexing the turbo encoded output bits; (g) bit interleaving in order to rearrange the order of the multiplexed output bits; and (h) transmitting the channel symbol in the packet form after mapping the bit interleaved output bits to a channel symbol.

The said (b) detecting whether there are any errors included in the packet by CRC decoding the channel symbol in the packet form comprises: (i) computing a bit metric for bits that constitute the equivalent CRC encoded and turbo encoded new message symbol by receiving the channel symbol transmitted in the packet form; (j) bit de-interleaving in order to rearrange the computed bit metric into the original order; (k) outputting the bit de-interleaved bit metric after de-multiplexing; (l) turbo decoding the message symbol iteratively using the de-multiplexed bit metric; and (m) transmitting a signal related to the request for retransmission of a packet according to the existence of errors after detecting whether there are errors in the packet by CRC decoding a forward error correction processed frame, which has passed through the iterative turbo decoding.

The (m) transmitting signal related to the request for retransmission of a packet preferably comprises: if it is determined that no error exists in the packet, transmitting an ACK signal to the transmitter through the feedback channel; and if errors are detected, the CRC decoder transmits a NAK signal to the transmitter through the feedback channel.

BRIEF DESCRIPTION OF THE DRAWINGS

FIG. 8 illustrates the comparison of a CRC generator polynomial in the related art and a CRC generator polynomial according to the present invention.

DETAILED DESCRIPTION OF THE PREFERRED EMBODIMENT

Hereinafter, a detailed description will be given with reference to the attached drawings as to preferred embodiments of the present invention.

The turbo encoded Hybrid Automatic Repeat reQuest (hereinafter, H-ARQ) system according to the preferred embodiment of the present invention is applicable to both type 1 H-ARQ and type 2 H-ARQ but, hereinafter, type 1 H-ARQ system, especially a Selective Repeat (SR) method will be explained. The buffer size of a transmitter and a receiver is assumed for present purposes to be infinite. A characteristic of the SR method is that a transmitter operates continuously in this method. In the SR method, the transmitter transmits frames in an order. The next frame to be transmitted is determined based on a signal received from a receiver during the process of transmitting the current frame.

Hereinafter, an explanation will be given with reference to FIG. 4 as to a turbo encoded H-ARQ system according to a preferred embodiment of the present invention.

Figure 1:
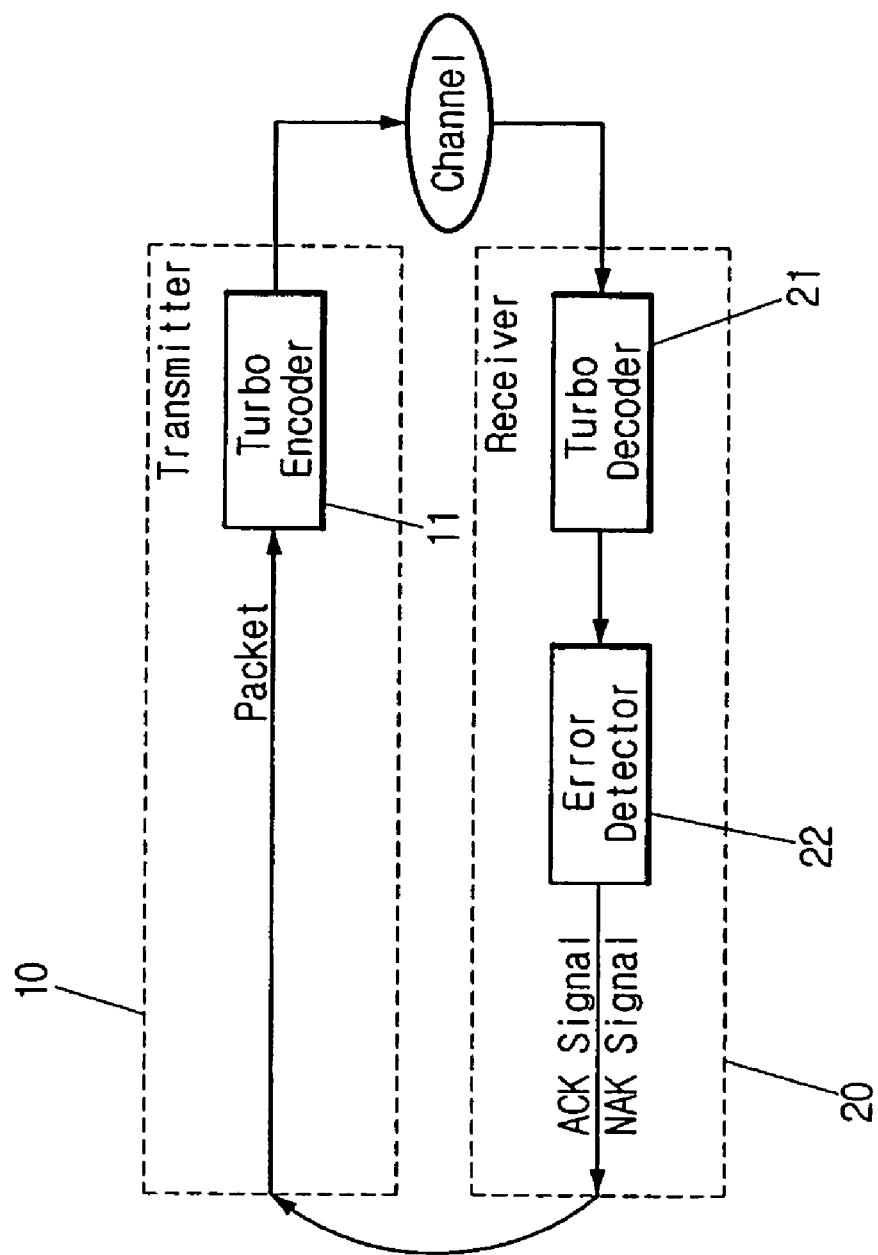
FIG. 1 is a block diagram that illustrates a turbo encoded H-ARQ system in the related art.
Figure 2:
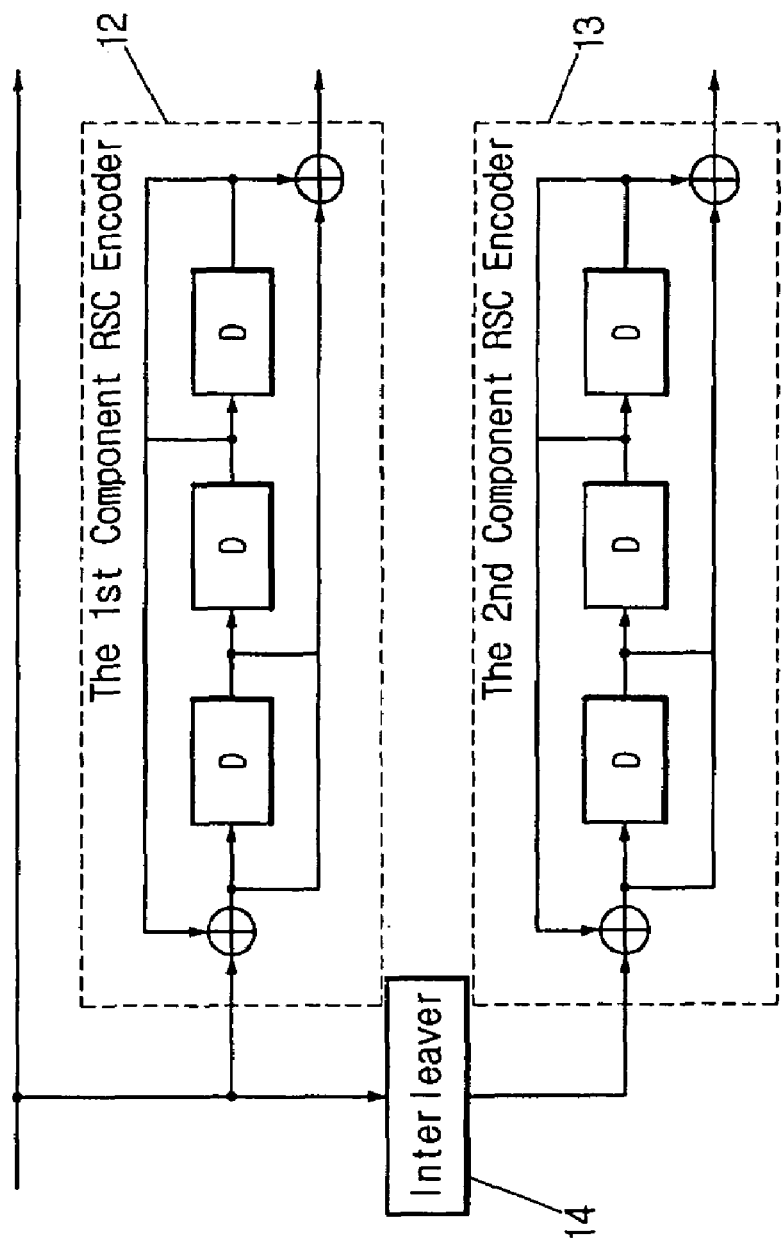
FIG. 2 is a diagram that illustrates the structure of a turbo encoder in the related art illustrated in FIG. 1.
Figure 3:
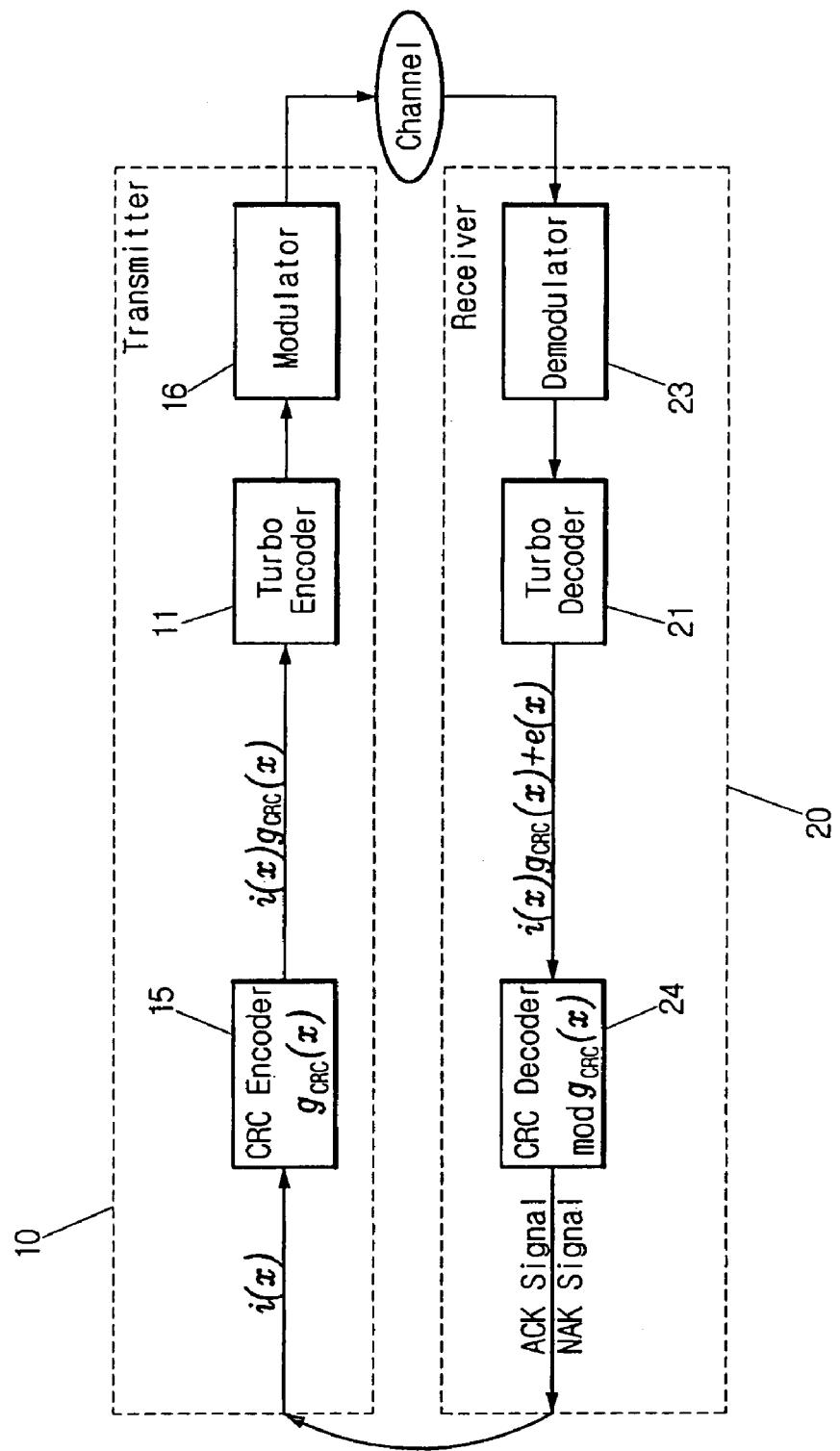
FIG. 3 is a block diagram that illustrates a CRC error detection method of the turbo encoded H-ARQ system in the related art.
Figure 4:
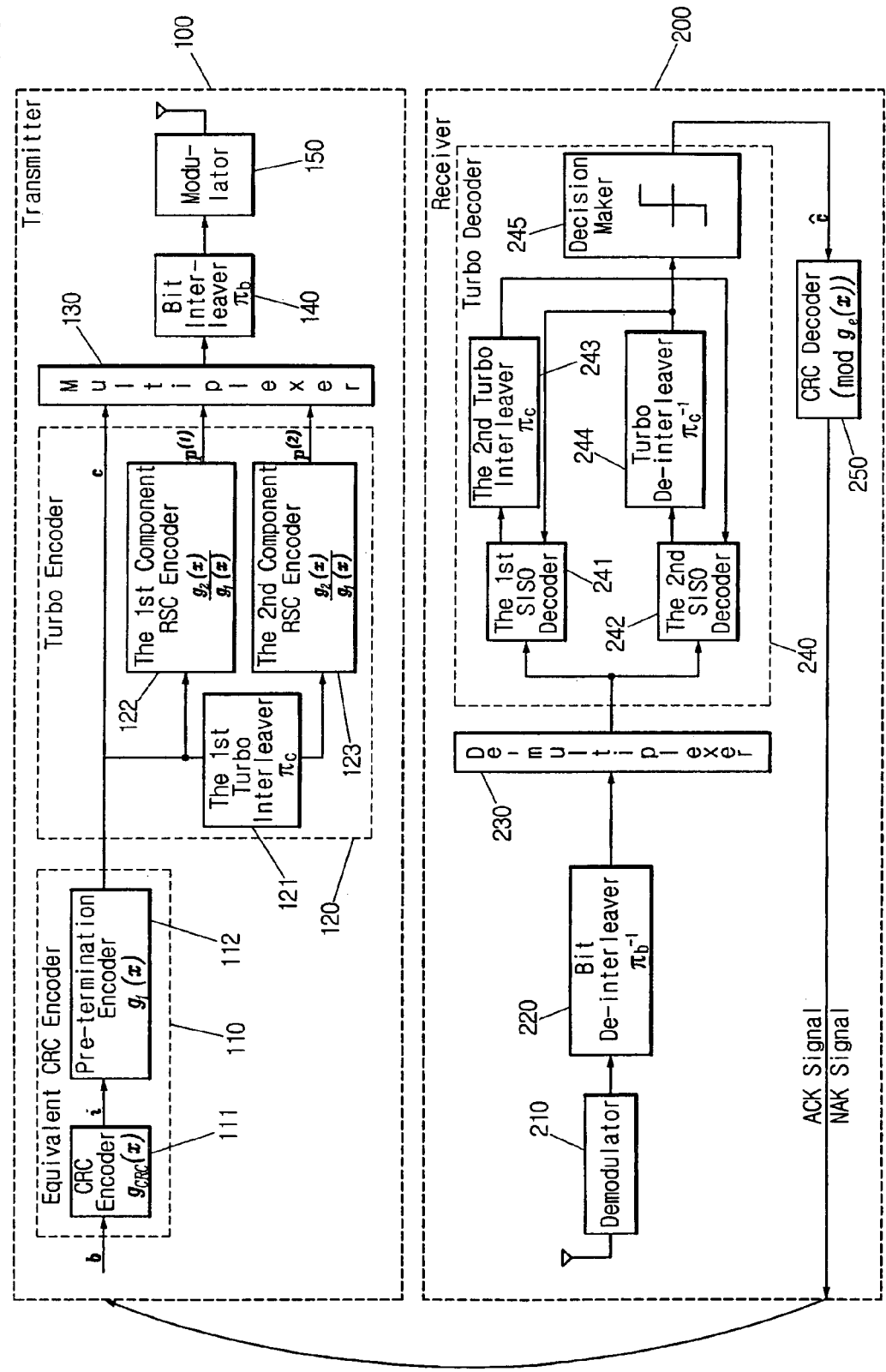
FIG. 4 is a block diagram that illustrates a turbo encoded H-ARQ system to which an error detection method according to a preferred embodiment of the present invention is applied.

FIG. 4 is a block diagram that illustrates a turbo encoded H-ARQ system to which an error detection method according to a preferred embodiment of the present invention is applied.

The turbo encoded H-ARQ system according to a preferred embodiment of the present invention has a modified trellis termination structure and comprises a transmitter (100) and a receiver (200). The transmitter (100) performs CRC encoding and pre-termination simultaneously by performing the equivalent CRC encoding of the inputted data bits using an equivalent CRC generator polynomial, multiplexes turbo encoded bits according to the equivalent CRC encoded output bits, maps the multiplexed output bits to a channel symbol by bit interleaving and then transmits the channel symbol in packet form to the receiver (200). The receiver (200) receives the channel symbol transmitted in the packet form from the transmitter (100), computes the bit metric for bits that constitute an equivalent CRC encoded and turbo encoded new message symbol, de-multiplexes the message symbol by the bit de-interleaving and then turbo decodes the de-multiplexed message symbol iteratively using the computed bit metric, detects whether there are errors in the packet by CRC decoding a forward error correction processed frame, which has passed through the iterative turbo decoding, and then transmits a signal related to the request for retransmission of a packet to the transmitter (100) according to the existence of errors.

The transmitter (100) comprises an equivalent CRC encoder (110), a turbo encoder (120), a multiplexer (130), a bit interleaver (140) and a modulator (150). The equivalent CRC encoder (110) performs both CRC encoding and pre-termination simultaneously by performing the equivalent CRC encoding of data bits to be transmitted using an equivalent CRC generator polynomial. The turbo encoder (120) turbo encodes the equivalent CRC encoded output bits and the multiplexer (130) multiplexes the turbo encoded output bits. The bit interleaver (140) performs the bit interleaving to rearrange the order of the multiplexed output bits and the modulator (150) maps the bit interleaved output bits to a channel symbol and transmits the channel symbol in packet form to the receiver (200). At this time, the modulator (150) performs mapping to multilevel symbols.

The equivalent CRC encoder (110) comprises a CRC encoder (111) and a pre-termination encoder (112). The CRC encoder (111) CRC encodes data bits to be transmitted using a CRC generator polynomial and outputs the CRC encoded data bits. The pre-termination encoder (112) performs pre-termination of the CRC encoded output bits using a feedback polynomial and outputs the output bits, which were performed by pre-termination. Here, K data bits may be expressed as $b=(b_0, b_1, \ldots, b_{K-1})$. A CRC generator polynomial of degree q may be expressed as $g_{CRC}(x)$. The output of the CRC encoder (111) may be expressed as $i=(i_0, i_1, \ldots, i_{K+q-1})$ and N output of the pre-termination encoder (112) may be expressed as $c=(c_0, c_1, \ldots, c_{N-1})$.

And the turbo encoder (120) comprises a first component RSC encoder (122), a second component RSC encoder (123) and a first turbo interleaver (121). The first component RSC encoder (122) turbo encodes the equivalent CRC encoded output bits according to the original input order and outputs the first output additional bits. The first turbo interleaver (121) turbo interleaves the equivalent CRC encoded output bits in order to rearrange the input order of the output bits. The second component RSC encoder (123) performs the turbo encoding according to the order of the equivalent CRC encoded output bits which were turbo interleaved by the first turbo interleaver (121) and outputs the second output additional bits.

Here, the turbo encoder (120) has the code rate of ⅓. The first component RSC encoder (122) and the second component RSC encoder (123) have the memory size of v and the generator polynomial $[1, g_2(x)/g_1(x)]$. When assuming that N equals K+q+v, the first component RSC encoder (122) outputs the first output additional bits, $p^{(1)}=(p_0^{(1)}, p_1^{(1)}, \ldots, p_{N-1}^{(1)})$ and the second component RSC encoder (123) outputs the second output additional bits, $p^{(2)}=(p_0^{(2)}, p_1^{(2)}, \ldots, p_{N-1}^{(2)})$. The turbo encoder (120) outputs systematic bits, $c=(c_0, c_1, \ldots, c_{N-1})$. In order to terminate the two component RSC encoders (122, 123) at the same time, the bit stream c is interleaved using the first turbo interleaver (121) $\pi_c$ having the size of N satisfying the condition (W. J. Blackert, E. K. Hall, and S. G. Wilson, "Turbo code termination and interleaver conditions," Electron. Lett., vol. 31, No. 24, 2082–2084, November 1995).

The receiver (200) comprises a demodulator (210), a bit de-interleaver (220), a de-multiplexer (230), a turbo decoder (240) and a CRC decoder (250). The demodulator (210) receives a channel symbol transmitted in packet form from the modulator (150) and computes a bit metric for bits that constitute the equivalent CRC encoded and turbo encoded new message symbol. The bit de-interleaver (220) performs the bit de-interleaving in order to rearrange the order of the computed bit metric into the original order. The de-multiplexer (230) de-multiplexes the bit de-interleaved bit metric and the turbo decoder (240) turbo decodes the message symbol iteratively using the de-multiplexed bit metric. The CRC decoder (250) detects whether there are errors in the packet by CRC decoding the forward error correction processed frame, that is to say, which has passed through the iterative turbo decoding and then transmits to the transmitter (100) signal related to the request for retransmission of a packet according to the existence of errors.

The turbo decoder (240) comprises the first Soft Input Soft Output (SISO) decoder (241), the second SISO decoder (242), the second turbo interleaver (243), a turbo de-interleaver (244) and a decision maker (245). The first SISO decoder (241) outputs renewed first extrinsic information using the systematic bit metric and the first output additional bit metric outputted from the de-multiplexer (230), and the second extrinsic information outputted from the turbo de-interleaver (244). The second turbo interleaver (243) performs turbo interleaving in order to rearrange the order of the outputted first extrinsic information. The second SISO decoder (242) outputs renewed second extrinsic information using the systematic bit metric and the second output additional bit metric outputted from the de-multiplexer (230), and the first extrinsic information outputted from the second turbo interleaver (243). The turbo de-interleaver (244) performs turbo de-interleaving in order to arrange the order of the outputted second extrinsic information according to the original order. The decision maker (245) makes a hard decision on the turbo interleaved soft output.

Hereinafter, the error detection method according to a preferred embodiment of the present invention will be explained with reference to FIG. 4 and FIG. 5.

Figure 5:
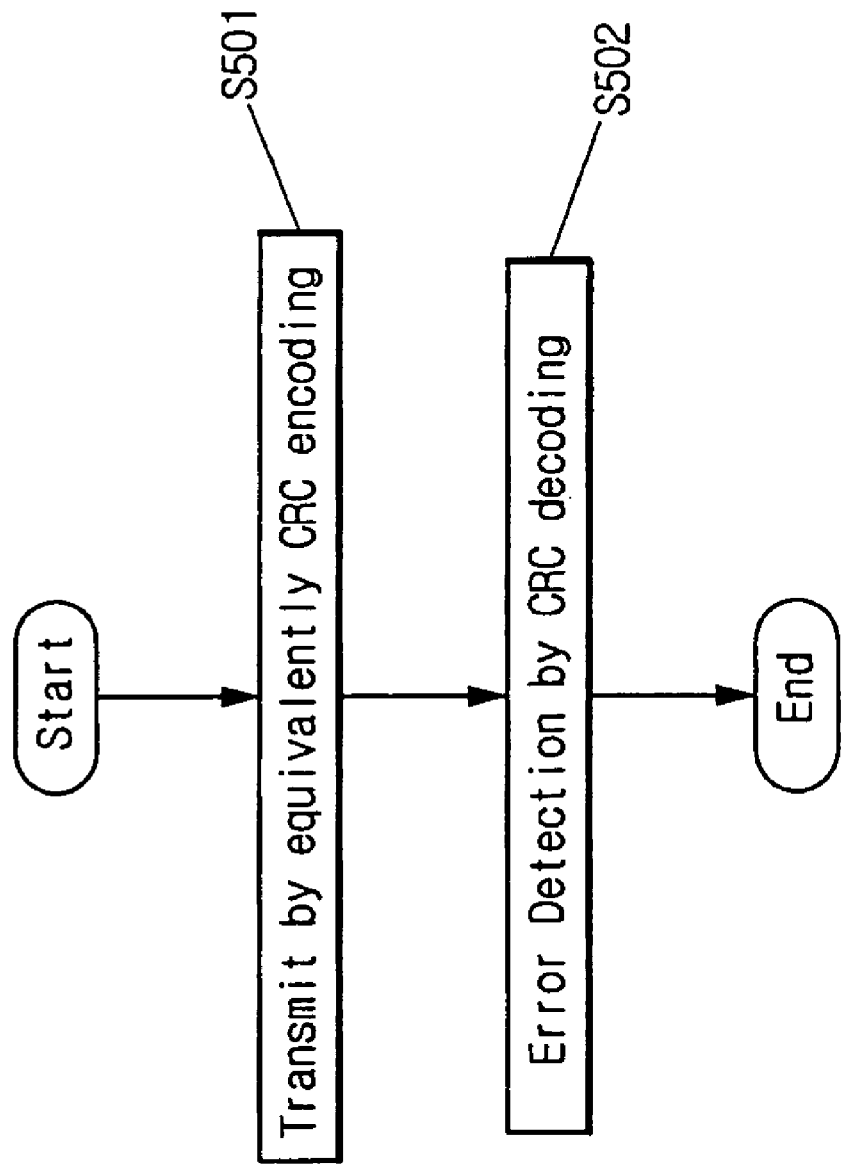
FIG. 5 is a flow chart that illustrates an error detection method according to a preferred embodiment of the present invention.

FIG. 5 is a flow chart that illustrates the error detection method according to a preferred embodiment of the present invention.

First, the transmitter (100) performs CRC encoding and pre-termination simultaneously by performing equivalent CRC encoding of the inputted data bits using an equivalent CRC generator polynomial, performs multiplexing of turbo encoded bits according to the equivalent CRC encoded output bits, performs mapping of the multiplexed output bits to a channel symbol by the bit interleaving and then transmits the channel symbol in the packet form to the receiver (200) (S501).

Thereupon, the receiver (200) receives the channel symbol transmitted in the packet form from the transmitter (100), computes a bit metric for bits that constitute the equivalent CRC encoded and turbo encoded new message symbol, performs de-multiplexing by bit de-interleaving and then turbo decodes the de-multiplexed message symbol iteratively using the computed bit metric, detects whether there are errors in the packet by CRC decoding the forward error correction processed frame, that is to say, which has passed through the iterative turbo decoding and then transmits signal related to the request for retransmission of a packet to the transmitter (100) according to the existence of errors.

Hereinafter, a detailed explanation will be given with reference to FIG. 4 and FIG. 6 as to the step of performing the equivalent CRC encoding and transmitting at the transmitter (100) (S501).

Figure 6:
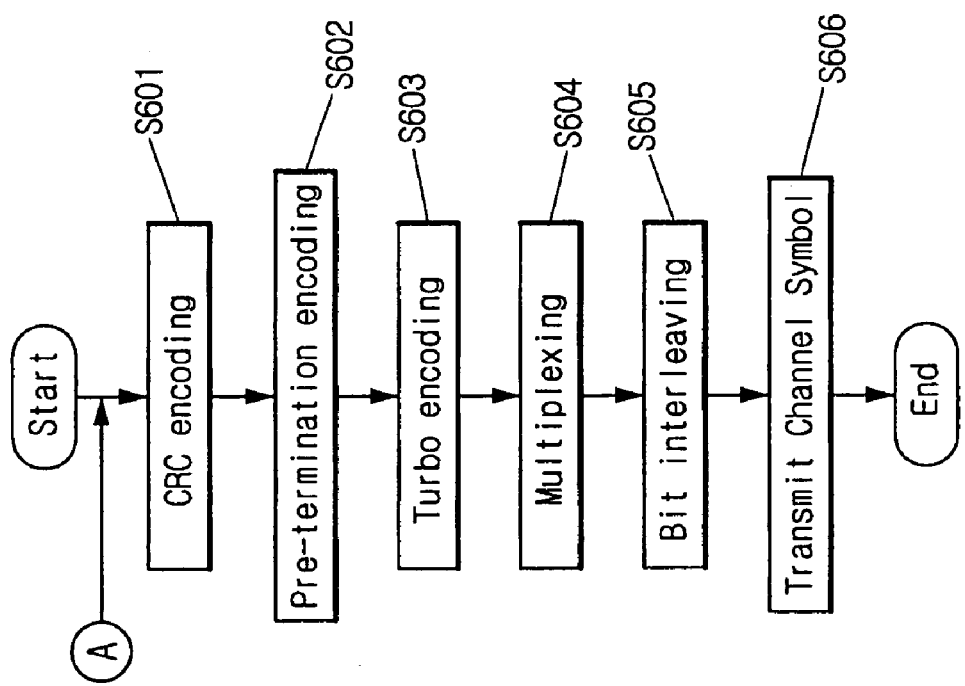
FIG. 6 is a flow chart illustrating that channel symbol in the packet form is transmitted after equivalently CRC encoding inputted data bits at a transmitter illustrated in FIG. 5.

FIG. 6 is a flow chart that illustrates the step of performing the equivalent CRC encoding and transmitting at the transmitter.

First, the CRC encoder (111) of the equivalent CRC encoder (110) in the transmitter (100) CRC encodes the information bit stream of K bits, $b=(b_0, b_1, \ldots, b_{K-1})$ using a CRC generator polynomial of degree q, $g_{CRC}(x)$ and then outputs the CRC encoded output bits (S601).

Then, for the pre-termination, the pre-termination encoder (112) performs pre-termination of the CRC encoded output $i=(i_0, i_1, \ldots, i_{K+q-1})$ using a feedback polynomial $g_1(x)$, unlike the related art trellis termination, and outputs the output bits of which were performed for pre-termination (S602). Here, $g_1(x)$ is the feedback polynomial of the component RSC encoders (122, 123) of the turbo encoder (120).

The turbo encoder (120) turbo encodes the pre-terminated N output bits $c=(c_0, c_1, \ldots, c_{N-1})$ and outputs the turbo encoded output bits (S603). Here, the turbo encoder (120) outputs an output bit stream of c, $p^{(1)}$, $p^{(2)}$. To make both component RSC encoders (122, 123) be terminated at the same time, the bit stream c is interleaved using the first turbo interleaver $\pi_c$ (121) of size N which satisfies the relevant condition.

Then, the multiplexer (130) multiplexes the turbo encoded output bits c, $p^{(1)}$, $p^{(2)}$ (S604).

The bit interleaver (140) $\pi_b$ performs the bit interleaving in order to rearrange the order of the multiplexed output bits (S605).

Thereafter, the modulator (150) maps the bit interleaved output bits to a channel symbol and transmits the channel symbol in the packet form to the receiver (200) (S606).

Hereinafter, an explanation will be given with reference to FIG. 4 and FIG. 7 as to the step of detecting errors by CRC decoding at the receiver (200).

Figure 7:
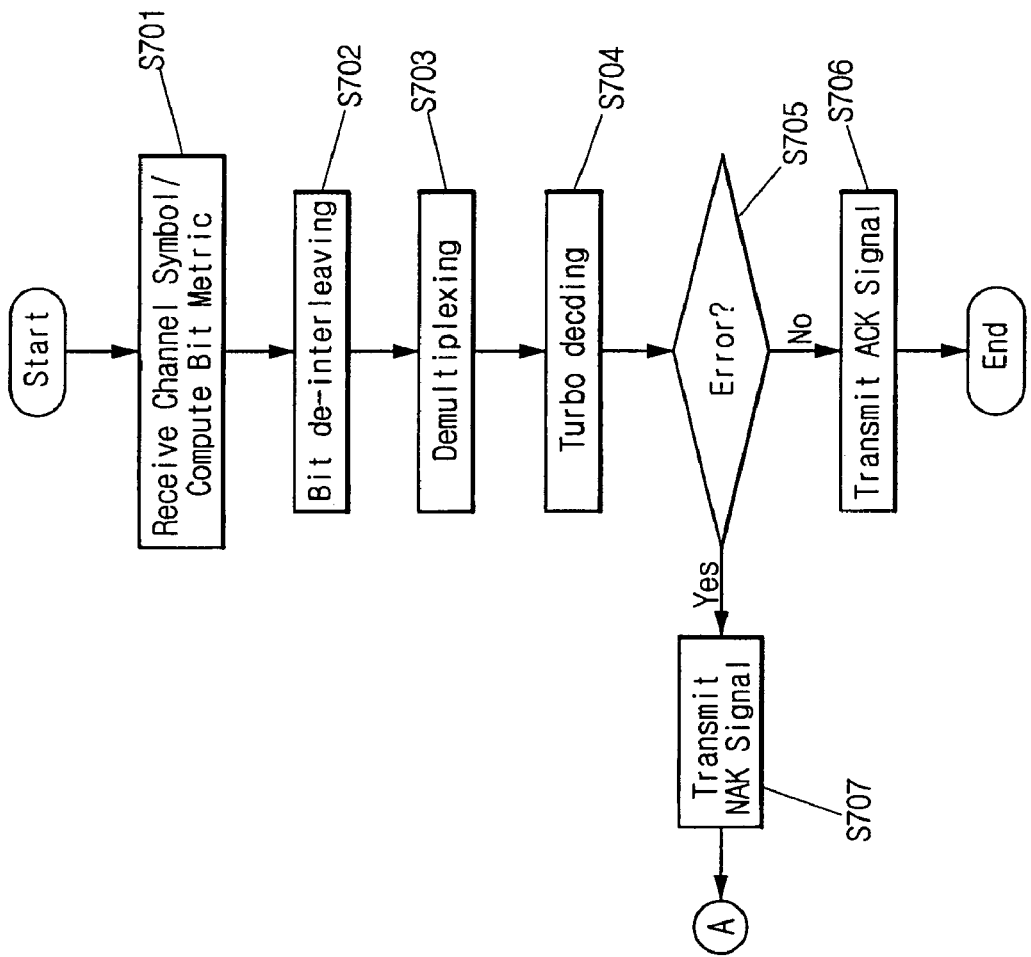
FIG. 7 is a flow chart illustrating that if there are any errors included in a packet they are detected by CRC decoding the channel symbol in the packet form and transmitting a signal after the equivalent CRC encoding at the receiver illustrated in FIG. 5.

FIG. 7 is a flow chart that illustrates the step of detecting errors, which is illustrated in FIG. 5, by CRC decoding at the receiver (200).

First, the demodulator (210) in the receiver (200) receives the channel symbol in the packet form transmitted from the modulator (150) and computes a bit metric for bits that constitute the equivalent CRC encoded and turbo encoded new message symbol (S701).

$x_l$ is a multilevel symbol transmitted at the lth symbol timing of the jth transmission and $$\alpha_l^{(j)}$$

is a complex Gaussian channel gain with zero mean and unit variance of 1 at the lth symbol timing of the jth transmission. The received signal $$y_l^{(j)}$$

at the lth symbol timing of the jth transmission is as follows.

$$y_l^{(j)} = \alpha_l^{(j)} x_l + \eta_l^{(j)} \quad \text{[Equation 5]}$$

Here, $\eta_l^{(j)}$ is zero-mean complex Additive White Gaussian Noise (AWGN) with the variance $$\frac{N_0}{2}$$

per dimension. The demodulator (210) in the receiver (200) uses the Chase combination (D. Chase, "Code combining a maximum-likelihood decoding approach for combining an arbitrary number of noisy packers," IEEE Trans. Commun., vol. 33, No. 2, 385–393, May 1985).

With respect to the ith bit metric at the lth symbol timing after the jth transmission, assuming that the demodulator (210) is exactly aware of the Channel State Information (CSI), the bit metric may be expressed as follows.

$$\lambda_l^J = \sum_{j=1}^{J} \log\left\{\sum_{x \in x_0^{(i)}} \frac{1}{\pi N_0} \exp\left(-\frac{|y_l^{(j)} - \alpha_l^{(j)} x|^2}{N_0}\right)\right\} - \sum_{j=1}^{J} \log\left\{\sum_{x \in x_1^{(i)}} \frac{1}{\pi N_0} \exp\left(-\frac{|y_l^{(j)} - \alpha_l^{(j)} x|^2}{N_0}\right)\right\} \quad \text{[Equation 6]}$$

Here, $x_0^{(i)}$ and $x_1^{(i)}$ are the sets of the symbols in which the ith bits are 0 and 1, respectively.

The bit de-interleaver (220) performs bit de-interleaving in order to arrange the order of the computed bit metric according to the original order (S702).

Then, the de-multiplexer (230) de-multiplexes the bit de-interleaved bit metric and outputs a systematic bit metric, the first output additional bit metric and the second output additional bit metric (S703).

Thereupon, the turbo decoder (240) performs turbo decoding iteratively using the de-multiplexed bit metric (S704). In other words, the bit metric computed in the demodulator (210) is fed into the SISO decoders (241, 242) for the iterative decoding process. In particular, the first SISO decoder (241) outputs renewed first extrinsic information using the systematic bit metric and the first output additional bit metric outputted from the de-multiplexer (230), and the second extrinsic information outputted from the turbo de-interleaver (244) to be described below. The second turbo interleaver (243) performs turbo interleaving to rearrange the order of the outputted first extrinsic information. The second SISO decoder (242) outputs renewed second extrinsic information using the systematic bit metric and the second output additional bit metric outputted from the de-multiplexer (230), and the first extrinsic information outputted from the second turbo interleaver (243). The turbo de-interleaver (244) performs turbo de-interleaving to arrange the order of the outputted second extrinsic information according to the original order. The decision maker (245) makes the hard decision on the turbo interleaved soft output.

Then, the CRC decoder (250) detects whether errors are included in the packet by CRC decoding the forward error correction processed frame, that is to say, which has passed through the iterative turbo decoding (S705).

If it is determined that no error exists in the packet, an ACK signal is sent back to the transmitter (100) through the feedback channel and thus the CRC decoded packet is delivered to the user (S706).

On the other hand, if errors are detected, a NAK signal is sent back to the transmitter (100) through the feedback channel (S707). Accordingly, the transmitter (100), upon receiving the NAK signal, retransmits the same packet (S601~S606). The receiver (200) again detects whether there are errors in the packet and transmits signal related to the request for retransmission of a packet to the transmitter (100) according to the existence of errors (S701~S707).

In other words, if there are errors in the packet, the iterative decoding process is repeated until the number of repetition reaches its maximum limit $I_{max}$. If there still are errors after the $I_{max}$ th repetition, a NAK signal is sent to the transmitter (100) and the same packet is retransmitted until the packet is received without any error or until the number of retransmission reaches the preset maximum number of retransmission w.

Hereinafter, a detailed explanation will be given with reference to equations as to an error detection method applied to the turbo encoded H-ARQ system according to a preferred embodiment of the present invention.

The present invention provides an error detection method at the receiver (200) for the transmitter (100) having a modified trellis termination structure.

The error detection method of the present invention performs CRC error detection using an equivalent CRC generator polynomial $g_e(x)$ having a higher degree than the CRC generator polynomial of the related art $g_{CRC}(x)$. Here, the equivalent CRC generator polynomial $g_e(x)$ is obtained by the following derivation. The output from the CRC encoder (111), i, should satisfy the following CRC equation.

$$i(x) \bmod (g_{CRC}(x)) = 0 \quad \text{[Equation 7]}$$

Here, $i = (i_0 + i_1 x + \ldots + i_{K+q-1} x^{K+q-1})$ is a polynomial form of i. With the modified trellis termination, the bit stream c may be expressed as follows in a polynomial form.

$$c(x) = c_0 + c_1 x + \ldots + c_{N-1} x^{N-1} \quad \text{[Equation 8]}$$
$$= i(x) \cdot g_1(x)$$

From Equation 7 and Equation 8, the following relationship may be satisfied.

$$c(x) \bmod (g_{CRC}(x) \cdot g_1(x)) = 0 \quad \text{[Equation 9]}$$

Since Equation 9 has the same form as the CRC equation of Equation 7, the equivalent CRC generator polynomial for the proposed error detection $g_e(x)$ may be expressed as follows.

$$g_e(x) = g_{CRC}(x) \cdot g_1(x) \quad \text{[Equation 10]}$$

The degree of the equivalent CRC generator polynomial $g_e(x)$ for the error detection method of the present invention is greater than that of $g_{CRC}(x)$ for the related art CRC error detection method by v. Accordingly, the error detection method of the present invention may achieve the undetected error probability, that has required q+v overhead bits for error detection, by using only q overhead bits. In other words, one of the remarkable characteristics of the error detection method of the present invention is that it requires only q overhead bits.

Hereinafter, a search for the equivalent CRC generator polynomial $g_e(x)$ will be explained.

Undetected error probability of an (N, K) linear error detection code c generated as an equivalent CRC generator polynomial $g_e(x)$ of degree q+v depends not only on the degree of $g_e(x)$ but also on the weight distribution of code c itself (S. K. Leuna-Yan-Cheong, and M. E. Hellman, "Concerning a bound on undetected error probability," IEEE Trans. Inform. Theory, vol. 22, No. 1, 235–237, March 1976).

The weight distribution of the code is as follows.

$$A(z) = \sum_{i=0}^{N} A_i z^i \quad \text{[Equation 11]}$$

Here, $A_i$ is the number of codewords having weight i. p is the average bit error probability after the turbo decoding. The undetected error probability $p_{ud}$ of code c in a turbo encoded H-ARQ system according to the preferred embodiment of the present invention is as follows.

$$P_{ud}(p) = \sum_{i=1}^{N} A_i p^i (1-p)^{N-i} \quad \text{[Equation 12]}$$

The average bit error probability after the turbo decoding p has a value that is much smaller than 1. Thus, the undetected error probability $p_{ud}$ in a turbo encoded H-ARQ system according to the preferred embodiment of the present invention depends on the minimum distance $d_{min}$ and the corresponding $A_{d_{min}}$. To achieve the smallest undetected error probability for the CRC error detection method, the equivalent CRC generator polynomial $g_e(x)$, which can generate the code c having the maximum $d_{min}$ and the minimum $A_{d_{min}}$, should be searched by using a computer calculation utilizing the Mac William's identity (R. E. Blahut, Theory and Practice of Error Control Codes. Addison-Wesley, 1984).

Hereinafter, results of an experiment for effect of the error detection method applied to a turbo encoded H-ARQ system according to the preferred embodiment of the present invention will be explained with reference to FIGS. 8, 9, 10a and 10b.

In a type 1 turbo encoded H-ARQ system with the proposed error detection method in an independent Rayleigh fading channel, a turbo encoder comprising two component RSC encoders $[1, 15/13]_{octal}$ is used for the experiment. In other words, the generator polynomial of the component RSC encoders is $[1, 15/13]_{octal}$.

Here, it is assumed that perfect channel state information (CSI) is available to the receiver.

FIG. 8 illustrates the comparison between the related art CRC generator polynomial and the equivalent CRC generator polynomial according to the present invention. FIG. 8 illustrates the CRC generator polynomials providing the largest $d_{min}$ and the smallest $A_{d_{min}}$ for the given codes with the length N and the number of data bits K.

The equivalent CRC generator polynomial $g_e(x)$ in the error detection method of the present invention provides $d_{min}$ that is greater than that (or when $d_{min}$ s are equal, $A_{d_{min}}$ that is smaller than that) in the CRC generator polynomial $g_e(x)$ in the related art error detection method. This is because the degree of the equivalent CRC generator polynomial $g_e(x)$ of the present invention is greater than that of the related art CRC generator polynomial $g_{CRC}(x)$ by v. Specifically, it is found that $d_{min}$ and $A_{d_{min}}$ provided by the CRC generator polynomial $g_{CRC}(x)$ are 2 and 1534 when q is 8 in FIG. 8. However, $d_{min}$ and $A_{d_{min}}$ provided by the equivalent CRC generator polynomial $g_e(x)$ are 3 and 85131. Thus, it is found that the equivalent CRC generator polynomial $g_e(x)$ provides a greater $d_{min}$ than the CRC generator polynomial $g_{CRC}(x)$ does. Here, even though $A_{d_{min}}$ provided by the equivalent CRC generator polynomial $g_e(x)$ is greater than $A_{d_{min}}$ provided by the CRC generator polynomial $g_{CRC}(x)$, the above conclusion still is reached because the effect of $d_{min}$ is greater than that of $A_{d_{min}}$.

Further, when q is 12, $d_{min}$ and $A_{d_{min}}$ provided by the CRC generator polynomial $g_{CRC}(x)$ are 4 and 18319200 whereas and $d_{min}$ abd $A_{d_{min}}$ provided by the equivalent CRC generator polynomial $g_e(x)$ are 4 and 1560520. Thus, it is found that the equivalent CRC generator polynomial $g_e(x)$ provides smaller $A_{d_{min}}$ than the CRC generator polynomial $g_{CRC}(x)$ does when the values of $d_{min}$ are equal.

Figure 9:
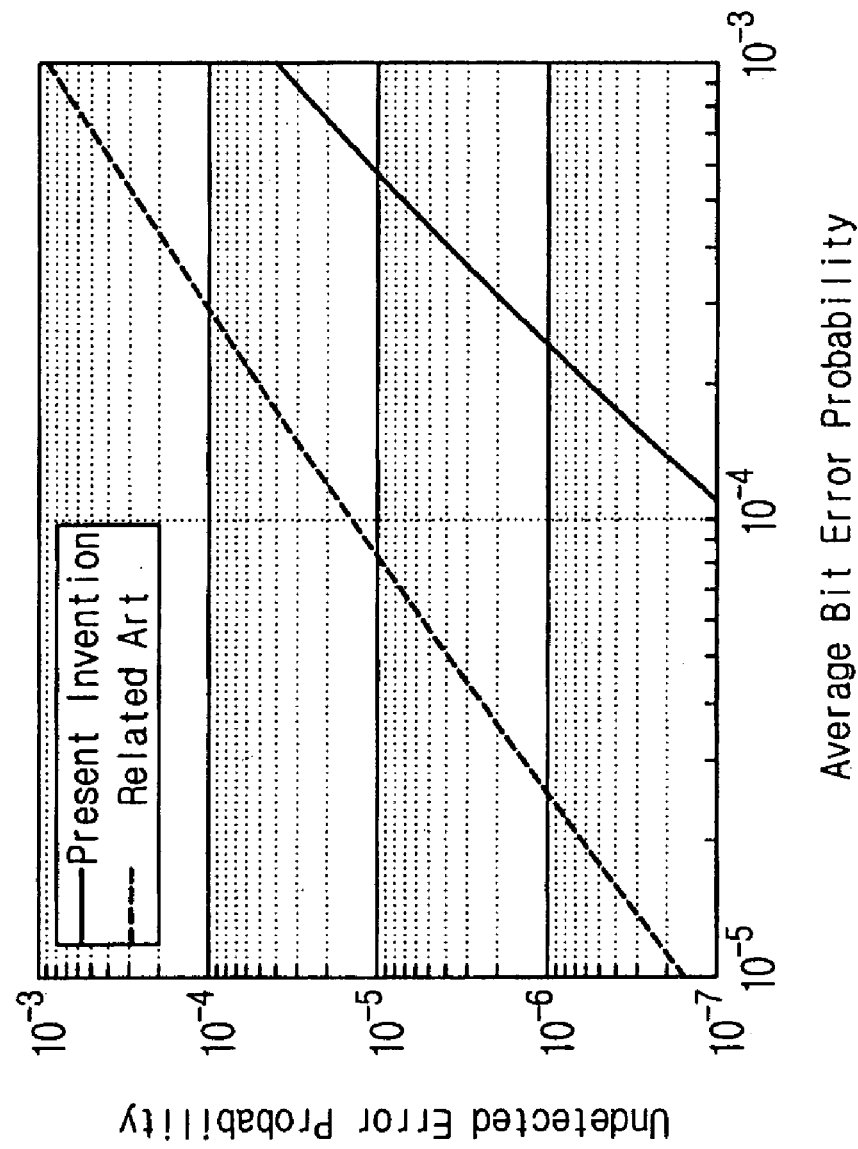
FIG. 9 illustrates the comparison of the undetected error probability in the related art CRC error detection method and the undetected error probability in the error detection method according to the present invention.

FIG. 9 illustrates the comparison of undetected error probability in the related art CRC error detection method and undetected error probability in the error detection method according to the present invention. Code (1024, 1013) generated by the equivalent CRC generator polynomial $g_e(x)=x^{11}+x^{10}+x^8+x^7+1$ is adopted for the error detection method of the present invention and code (1021, 1013) generated by the CRC generator polynomial $g_{CRC}(x)=x^8+x^7+x^6+x+1$ is adopted for the related art CRC error detection method. A codeword having the weight of 1 to 5 is included for the calculation and the undetected error probability is calculated according to the above Equation 12. Because the error detection method of the present invention has greater $d_{min}$ than the related art CRC error detection method, it is found that the undetected error probability in the error detection method of the present invention is lower than the undetected error probability in the related art CRC error detection method.

Figure 10A:
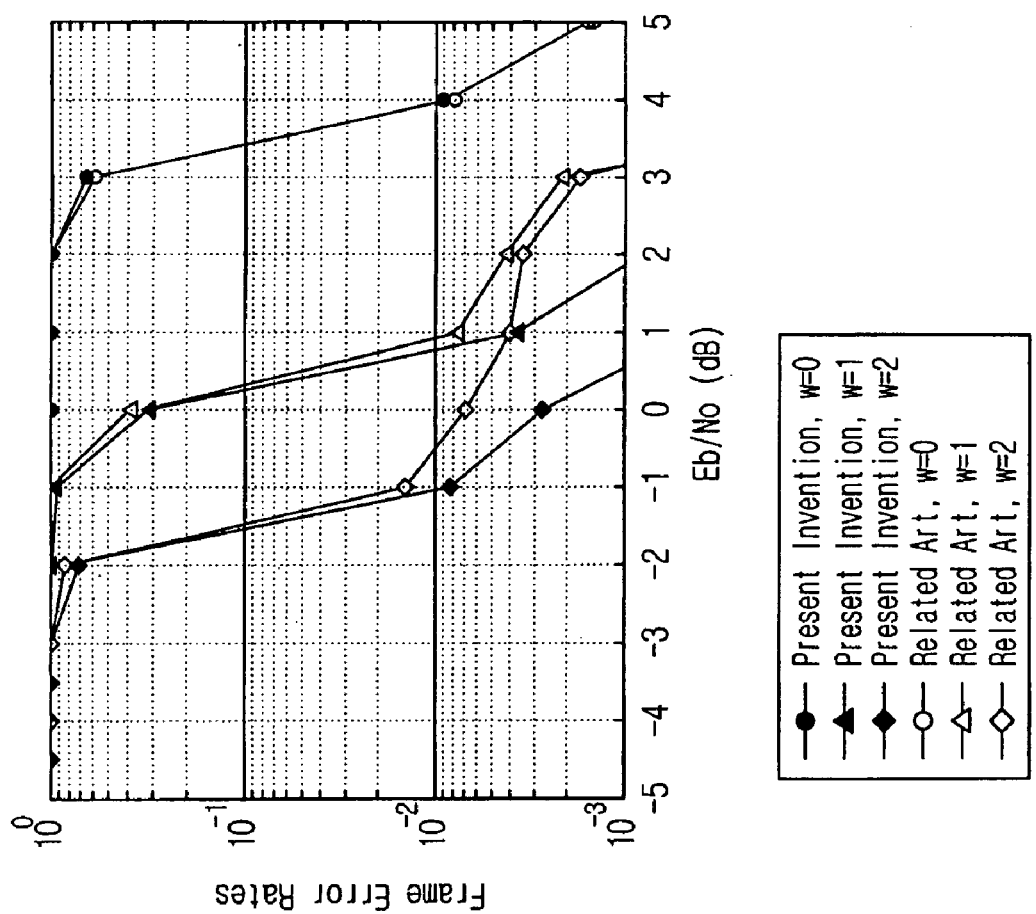
FIG. 10a illustrates the comparison of the frame error rates in the related art CRC error detection method and the frame error rates in the error detection method according to the present invention for QPSK.
Figure 10B:
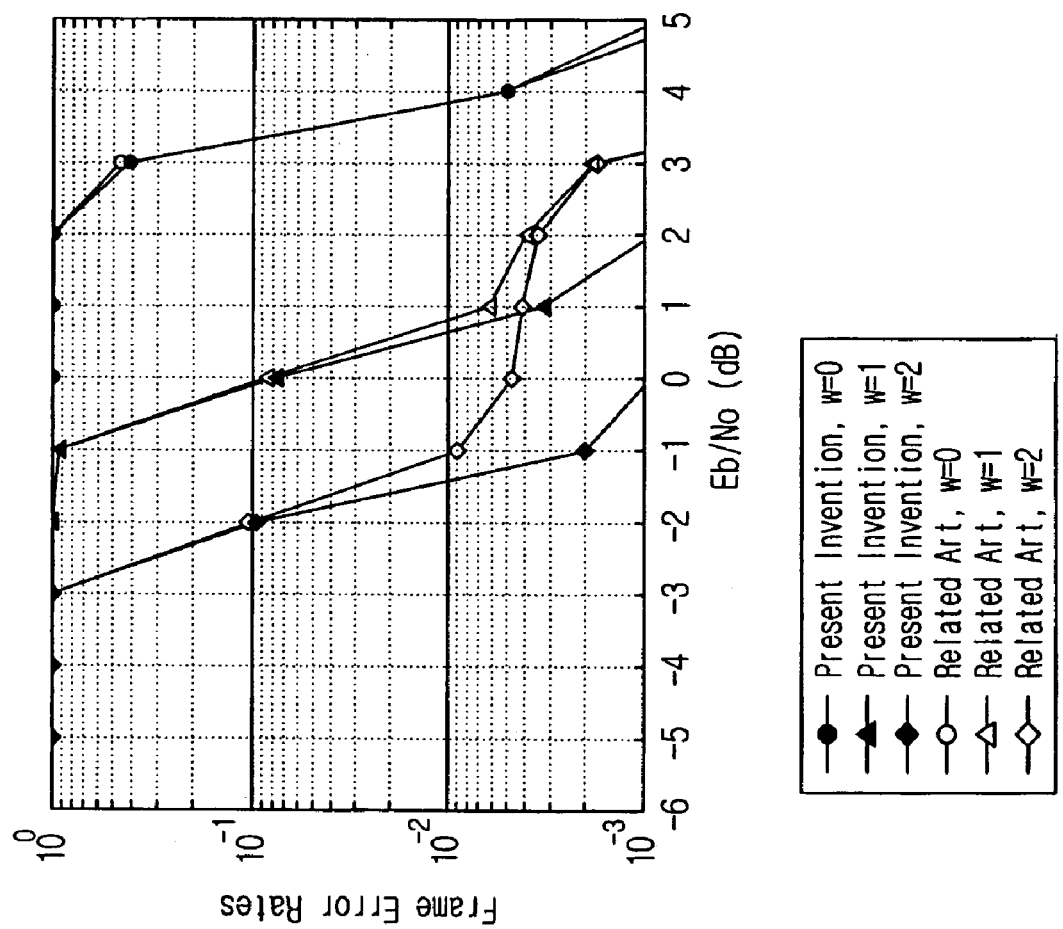
FIG. 10b illustrates the comparison of the frame error rates in the related art CRC error detection method and the frame error rates in the error detection method according to the present invention for 8-ary PSK.

FIG. 10a illustrates the comparison of the frame error rates in the related art CRC error detection method and the frame error rates in the error detection method according to the present invention for QPSK (quadrature phase shift keying). FIG. 10b illustrates the comparison of the frame error rates in the related art CRC error detection method and the frame error rates in the error detection method according to the present invention for 8-ary PSK. The equivalent CRC generator polynomial $g_e(x)$ considered in FIG. 9, the CRC generator polynomial $g_{CRC}(x)$, N of 1024 and K of 1013 are used for the experiment.

FIG. 10a illustrates frame error rates of a turbo encoded type 1 H-ARQ system using the QPSK modulation for the preset limits of retransmission w=0, 1 and 2. If retransmission is not performed, in other words, if w=0, the advanced feature of the undetected error probability according to the error detection method of the present invention does not affect frame error rates. Accordingly, frame error rates of the present invention and the related art method are equal. However, when the number of retransmission w is 1 or 2, the undetected error probability of the present invention is lower than the related art undetected error probability. Thus, it is found that the turbo type 1 H-ARQ system to which the error detection method of the present invention is applied has lower frame error rates than the turbo type 1 H-ARQ system to which the related art CRC error detection method is applied.

Further, the Chase combination at the demodulator in the receiver results in a gain in signal-to-noise ratio (SNR). It is found that the type 1 turbo encoded H-ARQ systems with the maximum retransmission numbers of 1 and 2 have gains of 2 and 3.7 dB in SNR over that of the system which does not perform retransmission.

FIG. 10b illustrates the result of an experiment using 8-ary PSK modulation when the numbers of the maximum retransmission w are 0, 1 and 2. It is found that, as the system using QPSK modulation, the turbo encoded type 1 H-ARQ system to which the error detection method of the present invention using 8-ary PSK is applied, has lower frame error rates than the turbo encoded type 1 H-ARQ system to which the related art CRC error detection method is applied.

The description of the present invention is intended to be illustrative, and not to limit the scope of the claims. Many alternatives, modifications and variations of the present invention may be embodied to the extent apparent to those skilled in the art.

As described above, according to the present invention, it is possible to obtain an equivalent CRC generator polynomial having a higher degree than the related art CRC generator polynomial by employing the modified trellis termination. Thus, it is possible to achieve lower undetected error probability than the related art undetected error probability by using the equivalent CRC generator polynomial having higher degree. Furthermore, even when the same number of overhead bits are used, according to the present invention, it is possible to achieve lower frame error rates than those in the related art due to the lower undetected error probability.

What is claimed is:

1. A turbo encoded hybrid Automatic Repeat reQuest (ARQ) system comprising:

a transmitter that, by equivalently Cyclic Redundancy Check (CRC) encoding inputted data bits using an equivalent CRC generator polynomial, performs CRC encoding and pre-termination simultaneously, multiplexes turbo encoded bits according to equivalent CRC encoded output bits, maps the multiplexed output bits to the channel symbol by bit interleaving, and transmits a channel symbol in packet form to a receiver; and the receiver receives the channel symbol transmitted in the packet form from the transmitter, computes a bit metric for bits that constitute an equivalent CRC encoded and turbo encoded new message symbol, de-multiplexes the received channel symbol by bit de-interleaving, turbo decodes the de-multiplexed new message symbol iteratively by using a computed bit metric, detects whether there are any errors included in the packet by CRC decoding a forward error correction processed frame, which has passed through the iterative turbo decoding, and transmits a signal related to a request for retransmission of a packet in accordance with an existence of errors, wherein the transmitter comprises:
  (i) an equivalent CRC encoder that performs both CRC encoding and pre-termination simultaneously by performing the equivalent CRC encoding of data bits to be transmitted using an equivalent CRC generator polynomial;
  (ii) a turbo encoder that turbo encodes equivalent CRC encoded output bits;
  (iii) a multiplexer that multiplexes the turbo encoded output bits;
  (iv) a bit interleaver that performs bit interleaving to rearrange an order of the multiplexed output bits; and
  (v) a modulator that maps the bit interleaved output bits to a channel symbol and transmits the channel symbol in the packet form to the receiver, wherein the turbo encoder comprises:
  (i) a first component Recursive Systematic Convolution (RSC) encoder that turbo encodes the equivalent CRC encoded output bits according to an original input order and outputs first output additional bits;
  (ii) a first turbo interleaver that turbo interleaves the equivalent CRC encoded output bits to rearrange an input order of the equivalent CRC encoded output bits; and
  (iii) a second component RSC encoder that performs the turbo encoding according to the order of the equivalent CRC encoded output bits which were turbo interleaved by the first turbo interleaver and outputs second output additional bits, and wherein the equivalent CRC encoder comprises:
(i) a CRC encoder that CRC encodes data bits to be transmitted using a CRC generator polynomial and outputs encoded data bits; and
(ii) a pre-termination encoder that performs pre-termination of the CRC encoded output bits by multiplying the CRC encoded output bits by a feedback polynomial of the first component RSC encoder or the second component RSC encoder, and outputs the output bits which were pre-terminated.

2. The system of claim 1, wherein the receiver comprises:
a demodulator that receives the channel symbol transmitted in the packet form from the modulator and computes the bit metric for bits that constitute the equivalent CRC encoded and turbo encoded new message symbol;
a bit de-interleaver that performs the bit de-interleaving to rearrange the order of the computed bit metric into the original order;
a de-multiplexer that de-multiplexes the bit de-interleaved bit metric;
a turbo decoder that turbo decodes the message symbol iteratively using the de-multiplexed bit metric; and
a CRC decoder that detects whether there are errors in the packet by CRC decoding a forward error correction processed frame, which has passed through iterative turbo decoding and then transmits to the transmitter a signal related to a request for retransmission of a packet in accordance with an existence of errors.

3. The system of claim 2, wherein the turbo decoder comprises:
a first Soft Input Soft Output (SISO) decoder that outputs renewed first extrinsic information using a systematic bit metric and a first output additional bit metric outputted from the de-multiplexer and second extrinsic information outputted from the turbo de-interleaver;
a second turbo interleaver that performs turbo interleaving to rearrange the order of the outputted first extrinsic information;
a second SISO decoder that outputs renewed second extrinsic information using the systematic bit metric outputted from the de-multiplexer, a second output additional bit metric and the first extrinsic information outputted from the second turbo interleaver;
a turbo de-interleaver that performs turbo de-interleaving to arrange the order of the outputted second extrinsic information according to the original order; and
a decision maker that makes a hard decision on the turbo interleaved soft output.

4. An error detection method comprising steps of:
transmitting a channel symbol in packet form after equivalently Cyclic Redundancy Check (CRC) encoding inputted data bits; and
detecting whether there are any errors included in a packet by CRC decoding the channel symbol in the packet form,
wherein said step of transmitting a channel symbol in packet form after equivalently CRC encoding inputted data bits comprises steps of:
(i) CRC encoding output bits after CRC encoding the data bits to be transmitted using a CRC generator polynomial;
(ii) outputting pre-termination output bits, after performing pre-termination of the CRC encoded output bits for pre-termination by multiplying the CRC encoded output bits by a feedback polynomial which is also used in a next step of turbo encoding;
(iii) turbo encoding the pre-termination output bits;
(iv) multiplexing the turbo encoded output bits;
(v) bit interleaving to rearrange the order of the multiplexed output bits; and
(vi) transmitting the channel symbol in the packet form after mapping the bit interleaved output bits to a channel symbol.

5. The method of claim 4, wherein said step of detecting whether there are any errors included in a packet by CRC decoding the channel symbol in the packet form comprises steps of:
computing a bit metric for bits that constitute an equivalent CRC encoded and turbo encoded new message symbol by receiving the channel symbol transmitted in the packet form;
bit de-interleaving to rearrange the computed bit metric into the original order;
de-multiplexing the bit de-interleaved bit metric;
turbo decoding the new message symbol iteratively using the de-multiplexed bit metric; and
transmitting a signal related to a request for retransmission of a packet according to an existence of errors after detecting whether there are errors in the packet by CRC decoding a forward error correction processed frame, which has passed through the iterative turbo decoding.

6. The method of claim 5, wherein said step of transmitting signal related to a request for retransmission of a packet comprises steps of:
if it is determined that no error exists in the packet, transmitting an acknowledge (ACK) signal to the transmitter through a feedback channel; and
if errors are detected, the CRC decoder transmits a not acknowledged (NAK) signal to the transmitter through the feedback channel.

* * * * *